(12) United States Patent
Carvalho et al.

(10) Patent No.: US 11,265,200 B2
(45) Date of Patent: Mar. 1, 2022

(54) METHOD AND APPARATUS FOR THE DECOMPOSITION OF SIGNALS WITH VARYING ENVELOPE INTO OFFSET COMPONENTS

(71) Applicants: Paulo Carvalho, Lisbon (PT); Rui Dinis, Costa da Caparica (PT); João Guerreiro, V. N. Azeitao (PT); Pedro Viegas, Linda-a-Pastora (PT); João Oliveira, Parede (PT); João Madeira, Quinta do Conde (PT)

(72) Inventors: Paulo Carvalho, Lisbon (PT); Rui Dinis, Costa da Caparica (PT); João Guerreiro, V. N. Azeitao (PT); Pedro Viegas, Linda-a-Pastora (PT); João Oliveira, Parede (PT); João Madeira, Quinta do Conde (PT)

( * ) Notice: Subject to any disclaimer, the term of this patent is extended or adjusted under 35 U.S.C. 154(b) by 0 days.

(21) Appl. No.: 16/447,024

(22) Filed: Jun. 20, 2019

(65) Prior Publication Data
US 2020/0403839 A1 Dec. 24, 2020

(51) Int. Cl.
*H04L 27/26* (2006.01)
*H04L 27/00* (2006.01)

(52) U.S. Cl.
CPC ...... *H04L 27/2659* (2013.01); *H04L 27/0014* (2013.01); *H04L 2027/0057* (2013.01)

(58) Field of Classification Search
CPC ............. H04L 27/2659; H04L 27/0014; H04L 2027/0057

USPC ........................................ 375/260; 455/127.3
See application file for complete search history.

(56) References Cited

U.S. PATENT DOCUMENTS

| | | | |
|---|---|---|---|
| 6,320,914 B1 | 11/2001 | Dent | |
| 6,470,055 B1 | 10/2002 | Fehr | |
| 2001/0016013 A1 | 8/2001 | Feher | |
| 2009/0311980 A1* | 12/2009 | Sjoland | H03F 3/68 455/127.3 |
| 2011/0038440 A1* | 2/2011 | Balbach et al. | H03D 3/00 375/334 |

(Continued)

OTHER PUBLICATIONS

P. Reynaert and M. Steyaert, RF Power Amplifiers for Mobile Communications, Springer, 2006.

(Continued)

*Primary Examiner* — Fitwi Y Hailegiorgis
(74) *Attorney, Agent, or Firm* — Leason Ellis LLP (57) ABSTRACT

A method and apparatus for decomposition of signals with varying envelope into offset components are disclosed here, that sample the time variant envelope of a single carrier (SC) or a multi-carrier (MC) band limited signal, quantizes the sampled value using $N_b$ quantization bits and decomposes the sample into $N_b$ in-phase and quadrature components that are combined in pairs and modulated to generate a set of $N_b$ offset signals. The pulse shape applied in each offset signal is selected according to the spectral mask needed for the signal and to minimize envelope fluctuations in each offset signal from the set of $N_b$ components.

14 Claims, 4 Drawing Sheets

(56) References Cited

U.S. PATENT DOCUMENTS

2015/0221313 A1* 8/2015 Purnhagen ............ G10L 19/008
704/500

OTHER PUBLICATIONS

Orthogonal Waveforms and Filter Banks for Future Communication Systems, Edition: 1st, Chapter: 18, pp. 462-485, Elsevier, 2009.
S. C. Cripps, RF Power Amplifiers for Wireless Communications. Artech House, 2006.
D. Falconer, S. Ariyavisitakul, A. Benyamin-Seeyar, and B. Eidson, "Frequency domain equalization for single-carrier broadband wireless systems", Communications Magazine, IEEE, vol. 40, No. 4, pp. 58-66, Apr. 2002.
P. Montezuma, A. Gusmão, "A pragmatic coded modulation choice for future broadband wireless communications", IEEE VTC'01 (Spring), Rhodes, Greece, May 2001.
R. Dinis, A. Gusmão and N. Esteves, "On broadband block transmission over strongly frequency-selective fading channels", IEEE Wireless'03, Calgary, Canada, Jul. 2003.
N. Benvenuto, R. Dinis, D. Falconer, and S. Tomasin, "Single carrier modulation with nonlinear frequency domain equalization: An idea whose time has come again", Proceedings of the IEEE, vol. 98, No. 1, pp. 69-96, Jan. 2010.
P. S. K. Leung and K. Feher, "F-QPSK—a superior modulation technique for mobile and personal communications", IEEE Trans. Broadcast., vol. 39, pp. 288-294, Jun. 1993.
H. C. Park, K. Lee and K. Feher, "Continuous phase modulation of spectrally efficient FQPSK signals", IEEE Vehicular Technology Conference, 1988, Philadelphia, PA, USA.
T. J. Hill, "A non-proprietary, constant envelope, variant of shaped offset QPSK (SOQPSK) for improved spectral containment and detection efficiency", IEEE MILCOM Conference Record, vol. 1, pp. 347-352, California, USA, Oct. 2000.

K. Murota and K. Hirade, "GMSK Modulation for Digital Mobile Radio Telephony", IEEE Transactions on Communications, vol. 29, Issue 7, pp. 1044-1050, Jul. 1981.
M. K. Simon, T. Yan, "Performance Evaluation and Interpretation of Unfiltered Feher-Patented Quadrature Phase-Shift Keying (FQPSK)", California Institute of Technology, JPL-NASA Publication, TMD Progress Report 42-137, Pasadena, California, May 15, 1999.
M. K. Simon and D. Divsalar, "A Reduced Complexity Highly Power Bandwidth Efficient Coded Feher-Patented Quadrature-Phase-Shift-Keying System with Iterative Decoding", JPL Progress report, vol. 145, No. 42, pp. 1-17, May 2001.
T. Aulin, N. Rydbeck and C. Sundberg, "Continuous phase modulation—Part II: Partial response signaling", IEEE Transactions on Communications, Vo. COM-29, pp. 210-215, Mar. 1981.
S. Shambayati, D. K. Lee, "GMSK modulation for deep space applications", IEEE Aerospace Conference, Montana, USA, Mar. 2012.
T. Lee, S. Wang, C. Liu, "FQPSK-O: An improved performance constant envelope modulation scheme for OQPSK", IEEE International Telemetering Conference, San Diego, USA, 1998.
A Gusmão and N. Esteves, "ENCAP-4: an OQPSK-type modulation technique for digital radio", IEEE Proc. I, Commun. Speech Vis., vol. 135, No. 1, pp. 105-110, Feb. 1988.
A. Gusmão, V. Gonalves, N. Esteves, "A novel approach to modeling of OQPSK-type digital transmission over nonlinear radio channels", in IEEE Journal on Selected Areas in Communications, Vo. 15, No. 4, pp. 647-655, 1997.
P. Laurent, "Exact and approximate construction of digital phase modulation by superposition of amplitude modulation pulses (AMP)", IEEE Transactions, COM-34, pp. 150-160, Feb. 1986.
P. Montezuma, A. Gusmão, "Design of TC-OQAM schemes using a generalized nonlinear OQPSK-type format", Electronic Letters, vol. 35, Issue 11, pp. 860/861, 1999.

* cited by examiner

METHOD AND APPARATUS FOR THE DECOMPOSITION OF SIGNALS WITH VARYING ENVELOPE INTO OFFSET COMPONENTS

BACKGROUND OF THE INVENTION

Field of the Invention

This invention pertains generally to signal transmitter and receiver systems, and more particularly to power efficient transmission systems, baseband processing systems, and to intermediate frequency (IF) and radio frequency (RF) signal generation and processing methods and systems including single carrier (SC) and multi carrier (MC) transmitters and receivers.

Description of Related Art

The overall power efficiency of a given transmission technique takes into account two effects. The first one is the detection power efficiency, which essentially can be measured as the required Signal-to-Noise ratio (SNR) for a given performance, and depends on the adopted modulation and receiver. The second aspect is the amplification efficiency that includes power amplifier efficiency and required amplifier backoff, which is lower-bounded by the peak-to-average power ratio (PAPR) of the adopted signals. Power amplifier efficiency and linearity are contradicting goals. The move from class A to class C means linearity decrease. Moving further to highly efficient switching amplifiers of class D and class E, results in highly nonLinear (NL) amplifiers [1].

In modern wireless communications, spectral efficiency should be fully optimized to be able to support high data rates. In limited bandwidth systems, this is done by adopting high order modulation methods characterized by high peak-to-average ratio signals, which need significant back-off levels for linear operation [2]. This scheme is not always suitable for using traditional power amplifiers (PA) because the PA should be designed so that it can handle the peak power level while, in general, it needs to work at a much lower average output power [3]. Traditionally, linear PAs are biased to have enough direct current (DC) input power to supply peak radio frequency (RF) output power conditions. Peak RF output power conditions generally occur when the RF input signal to the PA is at a maximum. The traditional approach to linearly amplify a variant envelope modulated signal is to "back off" the linear Class-A or Class-AB PA's output power until the distortion level is within acceptable limits. However, when the PA is "backed-off" from the peak RF output power conditions, the excess DC input power must be dissipated by the PA because it is not being transformed into useful RF output power. Unfortunately, this lowers efficiency significantly, especially for high PAPR signals, which is the case of the signals commonly used in long term evolution (LTE) and to be adopted in further generation of mobile communication systems.

Currently, block transmission techniques combined with frequency domain receivers are usually employed in severely time-dispersive channels [4]. Among these techniques, orthogonal frequency division multiplexing (OFDM) and single-carrier with frequency domain equalization (SC-FDE) schemes are the most commonly adopted. The overall signal processing requirements for OFDM and SC-FDE are similar, as well as the achievable coded performances [5, 6]. However, due to the large envelope fluctuations and PAPR of OFDM signals, SC-FDE schemes are clearly preferable when high power efficiency is intended [7]. However, conventional SC signals, even when employing bi-phase shift keying (BPSK), quadrature phase shift keying (QPSK), offset QPSK (OQPSK) or Staggered QPSK (SQPSK), and differentially-encoded phase-shift keying systems or variants of these systems such as differential BPSK (DBPSK) and differential QPSK (DQPSK), as well as in pi/4-DQPSK and trellis coded QPSK and DQPSK, have envelope fluctuations. Thus, linearized (LIN) or highly linear transmitters, including frequency up-converters and RF power amplifiers, are required on the transmitter side, while the receiver may require expensive linear components such as linear automatic gain control (AGC) circuits. A transmitter with nonlinear amplifier (NLA) reduces the time domain envelope fluctuation of conventional band-limited signals, due to the signal distortion that causes spectral restoration or spectral regrowth and may cause high levels of out-of-band spectral energy transmission.

Linearized or linear amplifiers are less RF power efficient (during the power "on" state, power efficiency being defined as the transmit RF power divided by DC power), are considerably more expensive and/or having less transmit RF power capability, are larger in size, and are not as readily available as NL amplifiers. The advantages of NLA over linear (LIN) amplifiers are even more dramatic at higher RF frequencies, such as frequencies above about 1 GHz for applications requiring low DC voltage.

To overcome this restriction, offset modulations such as, OQPSK, Feher patented Quadrature Phase Shift Keying (FQPSK) [8, 9], Feher Quadrature Modulation (FQAM) [10], MIL-STD SQPSK (Military Standard Shaped Offset Quadrature Phase-Shift Keying) [11], Gaussian minimum shift keying (GMSK) [12], FQPSK and Interference Jitter Free-QPSK (IJF-QPSK) [13, 14] and other Continuous Phase Modulation (CPM) schemes [15] are recommended due the low envelope fluctuation levels. Note that, GMSK with coherent demodulator can be viewed as an OQPSK-type of signal [16]. Also, FQPSK is another OQPSK-type modulation and the same is still valid for SQPSK, IJF-QPSK and other CPM modulations. Other offset transmission techniques and signal modulations are also disclosed in documents [17, 18, 19].

Document [17] discloses more efficient transmission methods that can be seen as inspired on the FQPSK format [8] and uses it for the definition of new schemes with better spectral efficiency such as FQAM, Feher's Gaussian Minimum Shift Keying (FGMSK) and Feher's Minimum Shift Keying (FMSK). Still, despite the codification rules and filtering employed in these signals format definitions, the signal design is always restricted to CPM signals based on offset in-phase and quadrature components and no bridge is provided to these formats and non-offset signals.

Document [18] discloses another transmission technique restricted to the offset format. This document discloses an apparatus for transmitting digital information streams in a bandwidth-efficient manner based on two GMSK signals that are added to form a new Quadrature Overlapped GMSK (QO-GMSK) modulated signal, which shows better spectral efficiency when compared with GMSK or FQPSK.

Improved FQPSK schemes based on a cubic spline interpolation to generate very smooth baseband waveforms were also disclosed in document [19], in order to increase the spectral efficiency and allow the use of class C power amplifier without spectrum regrowth.

Other authors have, also, proposed interpretations for OQPSK and FQPSK signals as trellis-coded modulations, achieving better power efficiency to these modulations. In

[14], the out of band radiation was reduced by replacing the IJF (Interference Jitter Free) encoder and cross-correlator by a single cross-correlator, where the cross-correlation mapping rule, based on symbol-by-symbol representation, eliminates the slope discontinuity associated to the IJF-QPSK cross-correlation operation. Also, in [14], M. K. Simon and T. Y. Yan proposed a new improved emission/reception method for FQPSK, using a symbol-by-symbol mapping operation combined with a trellis coding scheme. In [20], it was demonstrated that the encoded-amplitude-and-phase OQPSK (ENCAP-OQPSK) format, allows the description of a great variety of signals with or without constant envelope. The codification rules, inherent to this format, imply the specification of $4^N$ generating functions that are not null in the bit interval. It was also shown the format ability to analytically describe the signals after the transmission through a band-pass memoryless nonlinearity [20]. Under this format, the complex envelope can be described as function of $4^{N+1}$ not null pulses on the symbol time interval [−T,T] and by selecting proper generator functions, the signal interpretation of [4] can be viewed as a particular case of the ENCAP-OQPSK format.

Document [21] discloses a method that, by using the Volterra approach as proposed in [22], that allows nonlinear OQPSK type signals to be represented as a sum of linear OQPSK components, which are similar to a well-known representation of binary CPM signals when h=½. One advantage lies in the fact that the OQPSK type signal's format is preserved along any transmission chain which is made of linear blocks, each one characterized by a certain impulse response, and bandpass memoryless nonlinear blocks (the usual model for power amplifiers). It is shown that nonlinear distorted OQPSK-type signals submitted to a nonlinearity are still represented as a sum of OQPSK components (i.e., an OQPSK-type signal submitted to a nonlinearity is OQPSK-type) [21]. This concept was extended to offset quadrature amplitude modulation (OQAM) schemes, for the design of trellis coded OQAM (TC-OQAM) schemes with interesting coding gains [23]. Since, the different OQPSK components associated to TC-OQAM signals may have quasi-constant envelope, they can be separately amplified by different NL amplifiers without distortion [24]. This concept was extended to other constellations by taking advantage of the fact that a given multilevel constellation can be decomposed as the sum of several binary components [25], but still without interchange between non-offset and offset signals formats.

All cited documents disclose methods to construct offset modulations in order to achieve energy efficiency on power amplification and better spectral mask. From what is disclosed in cited documents, the advantages of the offset signals are obvious when it is intended to assure efficient power amplification. However, in cited documents the CPM signals are always based on offset signals and none of the disclosed techniques provide a bridge to represent non offset signals, commonly characterized by high envelope fluctuations, in terms of offset components. However, having in mind the advantages of offset signals already mentioned in cited documents, it seems advantageous to convert information signals into offset components, which is the purpose of the method and systems disclosed in present application.

The method and apparatus disclosed in present application converts an input signal into quantized offset components, characterized by the advantages already mentioned, i.e., lower envelope fluctuations and compact spectrum. None of the previous cited documents disclose a method to perform this conversion, since they are related with the generation, design and optimization of offset signals.

The method and systems disclosed in this application follow an approach with two crucial steps: oversampling of the input signal with an offset between samples of the in-phase and quadrature components followed by a quantization where the quantized value is decomposed into constant amplitude component signals. Hence, the method and systems disclosed here decompose a signal with a time varying envelope through an oversampling process with a time offset between the sample times of the in-phase and quadrature components, followed by a transformation of the time domain samples' values into a quantized value and the subsequent decomposition of the quantized samples of the in-phase and quadrature components as a sum of offset components. Moreover, since the quantizer's inputs are the time domain samples, i.e., the in-phase and quadrature components of the signal's envelope, the decomposition can be applied to any signal and does not have a specific signal format or constellation as a target. This also means that contrarily to the cited documents and the existing techniques, the method and systems disclosed herein turn possible the decomposition of any signal into offset components, with the distortion limited by the number of bits employed in the quantization process. The quantization bits are employed to generate for each in-phase and quadrature sample a set of $N_{bq}$ in-phase and $N_{bq}$ quadrature polar components with different phases and amplitudes that are combined to generate the set of $N_{bq}$ offset signals. Thus, the quantized offset version of the input signal is the result of the combination of the $N_{bq}$ offset components resulting from the combination of in-phase and quadrature polar signals with same amplitude. This also means that the distortion is majored by the effect of the quantization error $\varepsilon_q$ that is defined in terms of the dynamic range of the envelope of the input signal, since the offset introduced between the samples causes a negligible effect in the total distortion level of the final signal compared to the original one. In fact, the total distortion follows with the number of quantization bits rule like the rule applied to the signal to quantization noise ratio of a common quantization process, being the contribution of the offset to the distortion lower than 1 dB.

Also, the method and systems disclosed in the present application are not restricted to a specific modulation or constellation, since different modulations and constellations have only impact on the quantization rule, oversampling factor and the filter for the spectral mask, which can change according to the input and the signal to noise ratio required for each system.

INFORMATION DISCLOSURE STATEMENTS

Patents and publications relevant to the patentability of the instant claims, concerning a decomposition of signals with varying envelope into offset components method and systems.

[1] P. Reynaert and M. Steyaert, R F Power Amplifiers for Mobile Communications, Springer, 2006.
[1] Orthogonal Waveforms and Filter Banks for Future Communication Systems, Edition: 1st, Chapter: 18, pp. 462-485, Elsevier, 2009.
[3] S. C. Cripps, R F Power Amplifiers for Wireless Communications. Artech House, 2006.
[4] D. Falconer, S. Ariyavisitakul, A. Benyamin-Seeyar, and B. Eidson, "Frequency domain equalization for single-carrier broadband wireless systems," Communications Magazine, IEEE, vol. 40, no. 4, pp. 58-66, April 2002.

[5] P. Montezuma, A. Gusmão, "A pragmatic coded modulation choice for future broadband wireless communications", IEEE VTC'01 (Spring), Rhodes, Greece, May 2001.

[6] R. Dinis, A. Gusmão and N. Esteves, "On Broadband Block Transmission over Strongly Frequency-Selective Fading Channels", IEEE Wireless'03, Calgary, Canada, July 2003.

[7] N. Benvenuto, R. Dinis, D. Falconer, and S. Tomasin, "Single carrier modulation with nonlinear frequency domain equalization: An idea whose time has come again," Proceedings of the IEEE, vol. 98, no. 1, pp. 69-96, January 2010

[8] P. S. K. Leung and K. Feher, "F-QPSK—A Superior Modulation Technique for Mobile and Personal Communications", *IEEE Trans. Broadcast*, Vol. 39, pp. 288-294, June 1993.

[9] H. C. Park, K. Lee and K. Feher, "Continuous phase modulation of spectrally efficient FQPSK signals", IEEE Vehicular Technology Conference, 1988, Philadelphia, Pa., USA.

[10] K. Feher, "Feher keying (FK) modulation and transceivers including clock shaping processors", US 2001/0016013 A1, 2001

[11] T. J. Hill, "A Non-Proprietary, Constant Envelope, Variant of Shaped Offset QPSK (SOQPSK) for Improved Spectral Containment and Detection Efficiency", IEEE MILCOM Conference Record, Vol. 1, pp. 347-352, California, USA, October 2000.

[12] K. Murota and K. Hirade, "GMSK Modulation for Digital Mobile Radio Telephony", IEEE Transactions on Communications, Vol. 29, Issue 7, pp. 1044-1050, July 1981.

[13] M. K. Simon, T. Yan, "Performance Evaluation and Interpretation of Unfiltered Feher-Patented Quadrature Phase-Shift Keying (FQPSK)," California Institute of Technology, JPL-NASA publication, TMD Progress Report 42-137, Pasadena, Calif., May 15, 1999.

[14] M. K. Simon e D. Divsalar, "A Reduced Complexity Highly Power Bandwidth Efficient Coded Feher-Patented Quadrature-Phase-Shift-Keying System with Iterative Decoding", JPL Progress report, Vol. 145, No. 42, pp. 1-17, May 2001.

[15] T. Aulin, N. Rydbeck, and C. Sundberg, "Continuous phase modulation—Part II: Partial response signaling", IEEE Transactions on Communications, vol. COM-29, pp. 210-215, March 1981.

[16] S. Shambayati, D. K. Lee, "GMSK modulation for deep space applications", IEEE Aerospace Conference, Montana, USA, March 2012.

[17] K. Feher, "Spectrally efficient FQPSK, FGMSK, and FOAM for enhanced performance CDMA, TDMA, GSM, OFDN, and other systems", U.S. Pat. No. 6,470,055 B1.

[18] P. Dent, "Spectrally efficient modulation using overlapped GMSK", U.S. Pat. No. 6,320,914 B1, 2001.

[19] T. Lee, S. Wang, C. Liu, "FQPSK-O: An Improved Performance Constant Envelope Modulation Scheme for OQPSK", IEEE International Telemetering Conference, San Diego, USA, 1998.

[20] A. Gusmão and N. Esteves, "ENCAP-4: an OQPSK-type modulation technique for digital radio", IEE Proc. I, Commun. Speech Vis., Vol. 135, No. 1, pp. 105-110, February 1988.

[21] A. Gusmão, V. Gongalves, N. Esteves, "A novel approach to modeling of OQPSK-type digital transmission over nonlinear radio channels," in IEEE Journal on Selected Areas in Communications, vol. 15, no. 4, pp. 647-655, 1997.

[22] P. Laurent, "Exact and Approximate Construction of Digital Phase Modulation by Superposition of Amplitude Modulation Pulses (AMP)", IEEE Transactions, COM-34, pp. 150-160, February 1986.

[23] P. Montezuma, A. Gusmão, "Design of TC-OQAM schemes using a generalized nonlinear OQPSK-type format", Electronics Letters, Vol. 35, Issue 11, Pages 860-861, 1999.

[24] P. Montezuma, R. Dinis and F. Coelho, "A Robust Design of TC-OQAM Schemes with Nonlinear transmitters", IEEE MILCON'2010, San Jose, USA, October 2010.

[25] R. Dinis, P. Montezuma, N. Souto, and J. Silva, "Iterative Frequency-Domain Equalization for General Constellations", 33rd IEEE Sarnoff Symposium 2010, Princeton, USA, April 2010.

BRIEF SUMMARY OF THE INVENTION

In one embodiment of the method of decomposition of signals with varying envelope into offset components, an input signal with time-varying envelope s(t) is received, that can be a modulated single carrier signal, a modulated multi-carrier signal, a baseband SC signal or baseband MC signal and a clock reference signal for the sampling rate. The signal s(t) is processed by a phase splitter to obtain the in-phase component $s_I(t)$ and quadrature component $s_q(t)$. Both $s_I(t)$ and $s_q(t)$ are sampled at a sampling rate $f_s=1/T_s$, where $T_s$ denotes the sampling period, with a time offset between sample times to generate the sampled versions $s_{nI}$ and $s_{nQ}$ of the in-phase and quadrature component, respectively. The samples $s_{nI}$ of in-phase component (also herein referred as in-phase samples) and samples $s_{nQ}$ of quadrature component (also herein referred as quadrature samples) are quantized to generate the sets of $N_{bq}$ quantization bits corresponding to the quantized value of each component, and each set of $N_{bq}$ quantization bits is converted by a mapper into a set of $N_{bq}$ polar signals in which the sampled value is decomposed. Each signal in each set of $N_{bq}$ polar components is submitted to a filter with an impulsive response r(t) and a frequency response that achieves a bandwidth $B<f_s$ to generate the set of $N_{bq}$ in-phase and quadrature filtered components, with the pairs of components with the same amplitude being combined into $N_{bq}$ offset signals. These signals can be combined to generate a quantized offset version of the input signal or can be delivered to an amplification stage, where nonlinear amplifiers can be employed.

In another embodiment, a signal with time-varying envelope s(t) is sampled, the samples are submitted to a phase splitter to generate the samples of in-phase and quadrature components, being the quadrature component samples submitted to a delay to introduce a time offset. Both in-phase and quadrature samples are quantized in parallel by two quantizers with $N_{bq}$ bits. The in-phase quantized samples are decomposed into polar components that are filtered. Also, in-phase quantized samples are decomposed into polar components that are filtered. In-phase and quadrature filtered polar components with same amplitude are combined to form $N_{bq}$ offset component signals.

In another embodiment, a signal with time-varying envelope s(t) is decomposed into in-phase and quadrature components which are sampled with a time offset, quantized by one quantizer with $2 N_{bq}$ quantization bit. The two sets of $N_{bq}$ bits are processed by two mappers to decompose the quantized values into polar components. Both in-phase and quadrature polar components are filtered and components with same amplitude are then combined to form $N_{bq}$ offset component signals.

Embodiments of the invention are defined in the dependent claims. Other objects, advantages and novel features of the invention will become apparent from the following detailed description of the invention when considered in conjunction with the accompanying drawings and claims.

Embodiments of the invention can be practiced with modulated single carrier signals, modulated multi-carrier signals, baseband SC signals and baseband MC signals.

Embodiments of the invention can be implemented with analog and/or digital controls. The invention can be implemented with analog components or with a combination of analog components and digital components. Embodiments of the invention may be digitally implemented by field programmable gate arrays (FPGA), microprocessors or digital signal processors (DSPs) and with look up tables.

Additional features and advantages of the invention will be set forth in the description that follows. Yet further features and advantages will be apparent to a person skilled in the art based on the description set forth herein or may be learned by practice of the invention. The advantages of the invention will be realized and attained by the structure and methods particularly pointed out in the written description and claims hereof as well as the appended drawings.

It is to be understood that both the foregoing summary and the following detailed description are exemplary and explanatory and are intended to provide further explanation of embodiments of the invention as claimed. Embodiments of the invention are defined in the dependent claims. Other objects, advantages and novel features of the invention will become apparent from the following detailed description of the invention when considered in conjunction with the accompanying drawings and claims.

BRIEF DESCRIPTION OF THE FIGURES

The various aspects of embodiments of the present invention will be described with reference to the accompanying drawings, wherein generally similar reference numbers indicate identical or functionally similar elements. The various aspects of embodiments disclosed here, including features and advantages of the present invention outlined above are described more fully in the detailed description in conjunction with the drawings in which.

DETAILED DESCRIPTION OF THE INVENTION

Table of Contents
1. Introduction
2. Methods for decomposition of signals with varying envelope into offset components
3. Apparatus and systems for decomposition of signals with varying envelope into offset components
4. Summary
5. Conclusions 1. Introduction Methods, apparatuses and systems for decomposition of signals with varying envelope into offset components (DS-VEOC) are disclosed herein. High-level description of DSVEOC method and systems according to embodiments of the present invention will be provided in sections 2 and 3.

Some definitions are provided in this section only for convenience purposes and are not limiting. The meaning of these terms will be apparent for a person skilled in the art based on the entirety of the teachings provided herein.

Modulated signals can be described by $s(t)=s_I(t)\cos(2\pi f_c t)-s_q(t)\sin(2\pi f_c t)$, where $w_c=2\pi f_c$ denotes the angular frequency, $f_c$ denotes the carrier frequency, and $s_I(t)$ and $s_Q(t)$ denote the in-phase and the quadrature component, respectively. The signal can also be described by $s(t)=\text{Re}\{\tilde{s}(t)e^{jw_c t}\}$, where $\tilde{s}(t)=s_I(t)+js_Q(t)$ denotes the complex envelope, $s_I(t)$ denotes the in phase component, $s_Q(t)$ denotes the quadrature component, with the signal envelope given by $e(t)=\sqrt{(s_I(t))^2+(s_Q(t))^2}$. When e(t) is invariant along time the signal is said to be a constant envelope signal. Time varying envelope signal refers to a signal where e(t) varies with time. Having both non-constant envelope and phase, s(t) is said to be a time-varying complex envelope signal. The dynamic range (DR) of the envelope represents the range of values between which the signal's envelope varies. The dynamic range of the in-phase component (DRi) represents the range of values between which the in-phase component varies. The dynamic range of the quadrature component (DRq) represents the range of values between which the quadrature component varies.

For purposes of convenience, and not limitation, time varying complex envelope signals are sometimes referred to herein as time varying envelope signals.

Let us consider the input signal s(t) that is submitted to a phase splitter to obtain the output the in-phase component $s_I(t)$ and quadrature component $s_q(t)$. Both components are sampled at a sampling rate $f_s=1/T_s$, higher that the double of the bandwidth of the input signal, with a time offset of $\gamma T_s$ between the sampling instants of in-phase and quadrature components. The sampling process results, for the in-phase component, in the sampled signal $$s_{n,I}(t)=\Sigma_{n=0}^{+\infty}s_I(nT_s)\delta(t-nT_s),$$

where $\delta(t-nT_s)$ denotes the Dirac pulse at instant $nT_s$ and for the quadrature component results in the sampled signal $$s_{n,Q}(t)=\Sigma_{n=0}^{+\infty}s_Q(nT_s+\gamma T_s)\delta(t-nT_s-\gamma T_s),$$

where $\delta(t-nT_s-\gamma T_s)$ denotes the Dirac pulse at instant $nT_s+\gamma T_s$.

Let us denote as $s(nT_s)=s_n$ the time domain sample of the time-varying envelope signal at the sample instant $nT_s$ and $s_{nI}(nT_s)=s_{nI}$ and $s_{nQ}(nT_s+\gamma T_s)=s_{nQ}$ the corresponding samples of in-phase and quadrature components. The dynamic ranges of $s_{nI}$ and $s_{nQ}$ are DRi and DRq respectively. For purposes of convenience, but not a limitation, it is assumed that DRi=DRq.

Through quantization, the time domain sample $s_{nI}$ of the in-phase component can be transformed into a quantized symbol $s_{nI,q}$ taken from a finite alphabet of $2^{N_{bq}}$ possible quantization symbols $\in I=\{s_{I,0}, s_{I,1}, \ldots, s_{I,N_{QL}-1}\}$. Also, trough a quantization the time domain sample $s_{nQ}$ of the quadrature component can be transformed into a quantized symbol $s_{nQ,q}$ taken from a finite alphabet of $2^{N_{bq}}$ possible quantization symbols $\in Q=\{s_{Q,0}, s_{Q,1}, \ldots, s_{Q,N_{QL}-1}\}$. The $N_{bq}$ quantization bits and $N_{QL}=2^{N_{bq}}$ quantization levels applied in each component are defined in terms of the maximum quantization error $$\varepsilon_{Iq} = \frac{DRi}{2 \times 2^{N_{bq}}} = \frac{\Delta i}{2} \text{ and } \varepsilon_{Qq} = \frac{DRq}{2 \times 2^{N_{bq}}} = \frac{\Delta q}{2},$$

where $\Delta i$ and $\Delta q$ represent the quantization interval for the in-phase component and quadrature component, respectively. Since DRi=DRq, $\varepsilon_{Iq}=\varepsilon_{Qq}$ and $\Delta i=\Delta q=\Delta$. For each component $N_{bq}$ quantization bits $(\beta_{nI}^{(N_{bq})}, \beta_{nI}^{(N_{bq}-1)}, \ldots, \beta_{nI}^{(1)})$ and $(\beta_{nq}^{(N_{bq})}, \beta_{nq}^{(N_{bq}-1)}, \ldots, \beta_{nq}^{(1)})$ are employed in the quantizers. The polar representations of the quantization bits $(b_{nI}^{(N_{bq})}, b_{nI}^{(N_b-1)}, \ldots, b_{nI}^{(1)})$ and $(b_{nQ}^{(N_{bq})}, b_{nQ}^{(N_{bq}-1)}, \ldots, b_{nQ}^{(1)})$ are related with the quantization bits by $b_{nI}^{(m)}=(-1)^{\beta_{nI}^{(m)}}$ and $b_{nq}^{(m)}=(-1)^{\beta_{nq}^{(m)}}$, respectively.

Thus, the in-phase sample $s_{nI}$ is transformed into a quantized value taken from the finite alphabet of quantized values $\mathfrak{S}$ I, that can be represented as a sum of $N_{bq}$ polar components by $$s_{nI,qt}=\Sigma_{L=1}^{N_{bq}} 2^{L-1} \Delta \alpha_{nI,L},$$

with $\alpha_{nI,L}=b_{nI}^{(L-1)}=\pm 1$ and $2^{L-1}\Delta\alpha_{nI,L}$ representing the polar component corresponding to the L-th quantization bit.

The quadrature component of each symbol from the finite alphabet of quantized values $\mathfrak{S}$ Q, can be represented as a sum of $N_{mQ} \leq N_{bq}$ polar components, that are the result of the decomposition of quantization value $s_{nq,QT}$ into polar components given by $$s_{nQ,qt}=\Sigma_{L=1}^{N_{bq}} 2^{L-1}\Delta\alpha_{nQ,L},$$

with $\alpha_{nQ,L}=b_{nQ}^{(L-1)}=\pm 1$ and $2^{L-1}\Delta\alpha_{nQ,L}$ representing the polar component corresponding to the L-th quantization bit.

Thus, after the decomposition into polar components results for the in-phase component $$s_{nI,qt}(t)=\Sigma_{n=0}^{+\infty}\Sigma_{L=1}^{N_{bq}} 2^{L-1}\Delta\alpha_{nI,L}\delta(t-nT_s)=$$
$$\Sigma_{n=0}^{+\infty}\Sigma_{L=1}^{N_{bq}} s_{nI,qt}^L,$$

where $s_{nI,qt}^L=2^{L-1}\Delta\alpha_{nI,L}\delta(t-nT_s)$ denotes the polar representation of L-th quantization bit of the sample of in-phase component taken at instant $nT_s$ and for the quadrature component $$s_{nQ,qt}(t)=\Sigma_{n=0}^{+\infty}\Sigma_{L=1}^{N_{bq}} 2^{L-1}\Delta\alpha_{nQ,L}\delta(t-nT_s-\gamma T_s)=$$
$$\Sigma_{n=0}^{+\infty}\Sigma_{L=1}^{N_{bq}} s_{nQ,qt}^L,$$

with $s_{nQ,qt}^L=2^{L-1}\Delta\alpha_{nQ,L}\delta(t-nT_s-\gamma T_s)$ denoting the polar representation of L-th quantization bit of the sample of quadrature component taken at instant $nT_s+\gamma T_s$. Each signal in each set of $N_{bq}$ polar components is submitted to a filter with an impulsive response r(t) and a frequency response that achieves the cancelation of the first replica of the spectrum of the sampled signal, i. e. a filter with a bandwidth $B<f_s$. Since for each sample there are $N_{bq}$ in-phase signal components, then the $N_{bq}$ filters output the set of in-phase filtered components $$s_{nI,qt,F}^L=s_{nI,qt}^L * r(t)=2^{L-1}\Delta\alpha_{nI,L}\delta(t-nT_s)*r(t),$$
$$L=1,2,\ldots,N_{bq},$$

where the operator * denotes the convolution.

For the quadrature component after the $N_{bq}$ filters, we have the set of $N_{bq}$ quadrature filtered components $$s_{nQ,qt,F}^L=2^{L-1}\Delta\alpha_{nI,L}\delta(t-nT_s-\gamma T_s)*r(t),$$
$$L=1,2,\ldots,N_{bq}.$$

In-phase and quadrature pairs components with same amplitude are combined to generate $N_{bq}$ offset signals that summed generate the quantized version of the complex envelope of the original signal given by $$s_{nqt}(t)=\Sigma_{n=0}^{+\infty}[\Sigma_{L=0}^{N_{bq}} 2^{L-1}\Delta\alpha_{nI,L}r(t-nT_s)+$$
$$j2^{L-1}\Delta\alpha_{nQ,L}r(t-nT_s-\gamma T_s)].$$

2. Methods for Decomposition of Signals with Time Varying Envelope into Offset Components DSVEOC methods according to embodiments of the present invention rely on the ability to decompose signals with time varying envelope into several offset signal components, that when summed generate a quantized version of the original signal.

In the following descriptions, each embodiment is first presented conceptually using a mathematical derivation of underlying concepts of the embodiment. One embodiment of a method of operation of the DSVEOC is presented, followed by various system embodiments.

In all embodiments for purposes of convenience, and not limitation, the same quantization rule is assumed for both in-phase and quadrature components of input signal. It is noted that two identical quantizers with $N_{bq}$ bits are employed in these embodiments. It is also assumed DRi=DRq and the same number of quantization bits for in-phase and quadrature components for purposes of illustration, and not limitation. The scope of the invention covers the use of one quantizer for both in-phase and quadrature component, as well as the use of different quantizers and DRi≠DRq, and the implementation of such variations will be apparent to persons skilled in the art based on the teachings contained herein.

Accordingly, in one embodiment of the DSVEOC method the input signal s(t) that is submitted to a phase splitter to obtain the in-phase component $s_I(t)$ and quadrature component $s_q(t)$. Both components are sampled at a sampling rate $f_s=1/T_s$, with a time offset between sample times to generate the sampled versions $s_{nI}$ and $s_{nQ}$ of the in-phase and quadrature component, respectively. For purposes of convenience, and not limitation it is assumed that DRi=DRq. Each sampled signal component is submitted to a quantizer with $N_{bq}$ bits. This means, that the in-phase samples $s_{nI}$ are submitted to a quantizer to generate the set of quantization bits corresponding to the quantized value taken from the finite alphabet of quantized values $\mathfrak{S}$ I. This also means that the quadrature component samples $s_{nQ}$ are submitted to a quantizer to generate the $N_{bq}$ quantization bits that correspond to the quantized value taken from a finite alphabet $\mathfrak{S}$ Q. Next, the quantization bits of the in-phase component are submitted to a mapper to generate the $N_{bq}$ polar components given by $$s_{nI,qt}^L=2^{L-1}\Delta\alpha_{nI,L}\delta(t-nT_s),L=1,2,\ldots,N_{bq},$$

in which the quantized value can be decomposed.

Also, the quantization bits of the quadrature component are submitted to a mapper to generate the $N_{bq}$ polar components given by $$s_{nQ,qt}^L=2^{L-1}\Delta\alpha_{nQ,L}\delta(t-nT_s-\gamma T_s),L=1,2,\ldots,N_{bq},$$

in which the quantized value can be decomposed.

Each signal in each set of $N_{bq}$ polar components is submitted to a filter with an impulsive response r(t) and a frequency response that achieves the cancelation of the first replica of the spectrum of the sampled signal, i.e., a fitter with a bandwidth $B<f_s$. Since for each sample there are $N_{bq}$ in-phase polar components and $N_{bq}$ quadrature polar components, then the $N_{bq}$ filters output the set of $N_{bq}$ in-phase signal components $$s_{nI,qt,F}^L=s_{nI,qt}^L*r(t),L=1,2,\ldots,N_{bq},$$

and the set of $N_{bq}$ quadrature signal components $$s_{nQ,qt,F}^L=s_{nQ,qt}^L*r(t),L=1,2,\ldots,N_{bq}.$$

Next, after the filter, the in-phase and quadrature pairs of components with same amplitude are combined to generate $N_{bq}$ offset signals $$s_{n,qt,F}^L = s_{nI,qt,F}^L + s_{nQ,qt,F}^L, L=1,2,\ldots,N_{bq}.$$

These signals can be delivered to an amplification stage, where nonlinear amplifiers are employed.

It is important to mention that the sum of the $N_{bq}$ offset signal generates the quantized version of the complex envelope of the original signal given by $$s_{n_{qt}}(t) = \Sigma_{n=0}^{+\infty} [\Sigma_{L=0}^{N_{bq}} s_{nI,qt,F}^L + s_{nQ,qt,F}^L].$$

Figure 1:
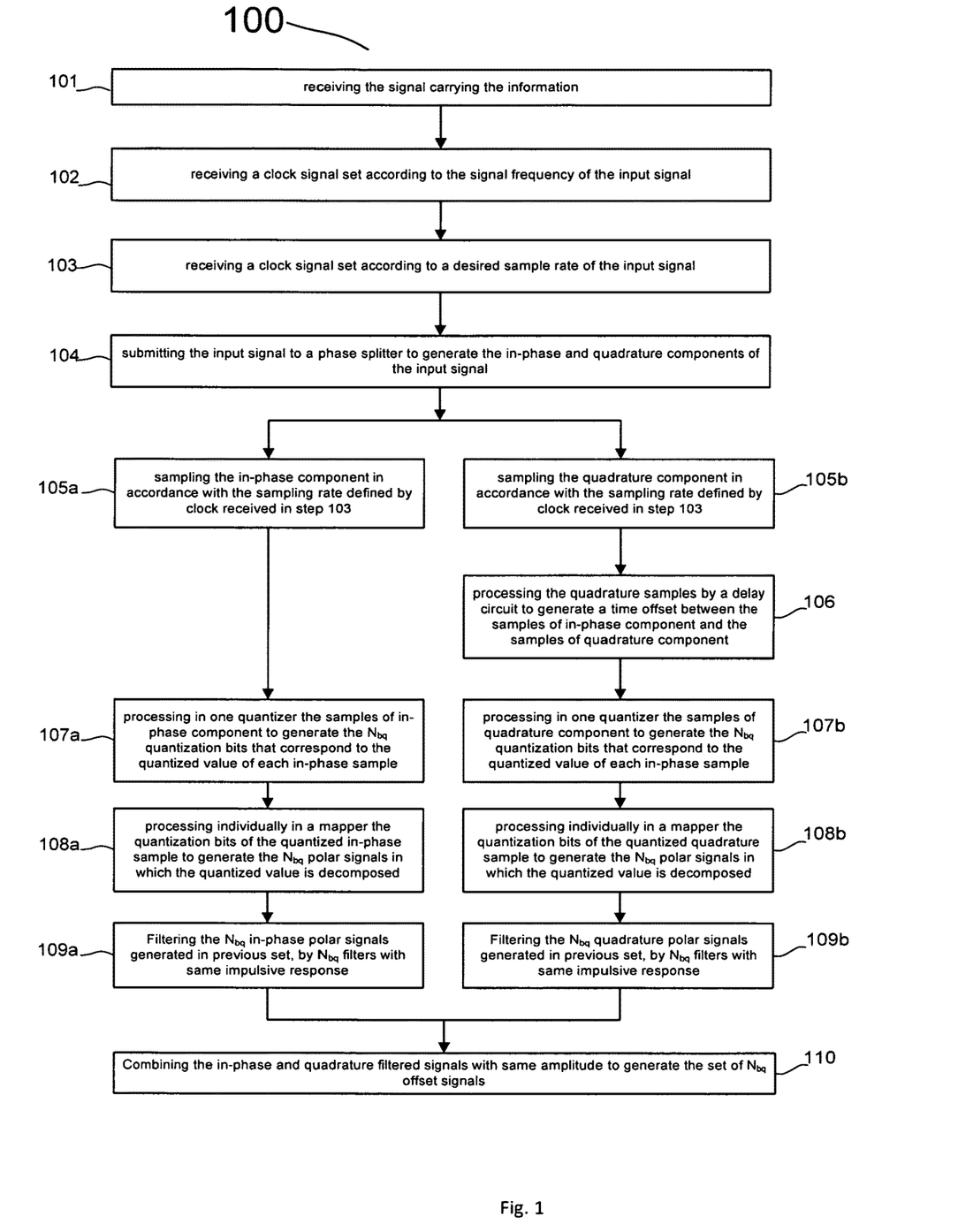
FIG. 1 is a process flowchart embodiment according to the decomposition of signals with varying envelope into offset components method.

The operation of the DSVEOC embodiment shall be described further with reference to the flowchart of FIG. 1. Optional components are illustrated with dashed lines. The process starts at step 101, which includes receiving the signal s(t) carrying the information, that will be decomposed into quantized offset components. In another embodiment this involves receiving the baseband signal carrying the information. In another embodiment this involves receiving the signal s(t) carrying the information in the intermediate frequency. In another embodiment this involves receiving the in-phase and quadrature components of the signal carrying the information.

Step 102 includes receiving a clock signal set according to the signal frequency of the input signal.

Step 103 includes receiving a clock signal set according to a desired sample rate of the input signal. It is important to mention that as understood by a person skilled in the art the sampling rate may vary according to the bandwidth of the input signal and the desired time resolution of the sampling process.

Step 104 includes submitting the input signal to a phase splitter to generate the in-phase and quadrature components of the input signal.

Step 105a includes sampling the in-phase component in accordance with the sampling rate defined by the clock received in step 103. In the embodiment example of FIG. 1, step 105a is implemented by a sampling circuit or a sample and hold (S/H) circuit.

Step 105b includes sampling the quadrature component in accordance with the sampling rate defined by the clock received in step 103. In the embodiment example of FIG. 1, step 105b is implemented by a sampling circuit or a sample and hold (S/H) circuit. In some embodiments with multi-carrier signals steps 105a and 105b can be implemented by a Fast Fourier transform (FFT) with a higher time resolution.

Step 106 includes processing the quadrature samples by a delay circuit to generate a time offset between the samples of the in-phase component and the samples of quadrature component.

Step 107 includes processing in one quantizer the samples of in-phase component and processing in another quantizer the samples of quadrature component to generate the quantization bits that correspond to the quantized value of each sample of in-phase component and the quantization bits that correspond to the quantized value of each sample of quadrature component, respectively. As understood by a person skilled in the art based on the teaching herein, step 107 can be performed by a block using a single quantizer for samples of both components. Also, as understood by a person skilled in the art based on the teaching herein, step 107 can be performed by a comparator and a LUT with the corresponding quantization bits of the quantized values.

Step 108a includes processing individually in an in-phase mapper the quantization bits of the quantized value of sample of in-phase component, also denoted as quantized in-phase sample, to generate the polar signals in which the quantized value is decomposed according to $s_{nI,qt} = \Sigma_{L=1}^{N_{bq}} 2^{L-1}\Delta\alpha_{nI,L}$. Step 108b includes processing individually in a quadrature mapper the quantization bits of the quantized value of sample of quadrature component, also denoted as quantized quadrature sample, to generate the polar components in which the quantized value is decomposed according to $s_{nQ,qt} = \Sigma_{L=1}^{N_{bq}} 2^{L-1}\Delta\alpha_{nQ,L}$. As understood by a person skilled in the art based on the teaching herein, step 108b can be performed by a comparator and a LUT with the corresponding amplitudes and phases of the quantization bits for quantized values of both components' samples. It is important to note that in certain embodiments of the present invention steps 107, 108a and 108b can be performed by a block that quantizes and generates directly the quantization bits and the corresponding polar signals for the in-phase and quadrature components.

Step 109A includes processing the polar in-phase components by filtering each polar in-phase component by a filter with the desired spectral shape and a bandwidth lower than the sampling frequency.

Step 109B includes processing the polar quadrature components by filtering each polar quadrature component signal by a filter with the desired spectral shape and bandwidth lower than the sampling frequency.

Step 110 includes processing the in-phase signals and quadrature signals by summing pairs of signals with same amplitude to generate a set of $N_{bq}$ offset signals that summed are equal to a quantized version of the input signal.

Figure 2:
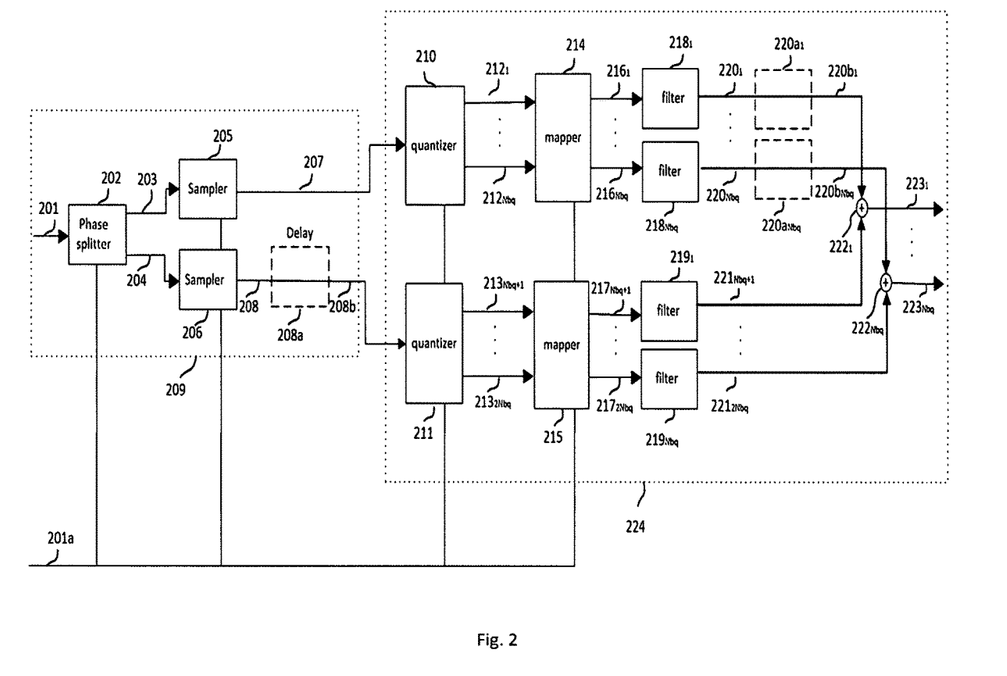
FIG. 2 is a block diagram that illustrates an exemplary embodiment of an apparatus for decomposition of signals with varying envelope into offset components.

3. Apparatus and Systems for Decomposition of Signals with Varying Envelope into Offset Components Block diagram 200 of FIG. 2 is an example that illustrates a possible embodiment of the DSVEOC system implementing the process flowchart 100 of FIG. 1. In the example of FIG. 2, optional components are illustrated with dashed lines. In other embodiments, additional components may be optional. In this example, a data signal with time varying envelope 201 is received, a clock reference signal 201a for the sampling process is also received as input. In another embodiment, the signal 201 can be the in-phase and quadrature components of a time-varying envelope signal and the phase splitter 202 is not required. In another embodiment the signal 201 can be the in-phase and quadrature samples of a time-varying envelope signal and the phase splitter 202 and samplers 205 and 206 are not required. In other embodiments signal 201 can be a baseband signal, or IF signal.

The clock reference signal 201a can be used by the sampling blocks 205 and 206, by the quantizers 210 and 211 and mappers 214 and 215. The common clock signal 201a is used to ensure that the outputs of the quantizers 212-{1, ..., $N_{bq}$} and 213-{1, ..., $N_{bq}$} are time aligned, to ensure that the outputs of mappers 214 and 215 are time synchronized and the outputs 216-{1, ..., $N_{bq}$} and 217-{1, ..., $N_{bq}$} are also synchronized. It can be understood by a person skilled in the art that the choice of the clock reference signal is made according the bandwidth of the input signal and the desired sampling rate. In this embodiment the in-phase and quadrature offset sampler block 209 is composed by phase splitter 202, the samplers 205 and 206 and may have an optional delay block at the output of the quadrature sampler 206. Signals 207 and 208 are the outputs of 209, that are delivered to the quantizers of offset component generator 224.

The phase splitter 202 generates the in-phase component 203 and the quadrature component 204 of the input signal 201. Still referring to FIG. 2, the in-phase and quadrature components are sampled by the samplers 205 and 206 with a sampling rate of $f_s$ and a time offset between the sampling instants of 205 and 206, respectively. In another embodiment, an optional delay block is employed at the output of the sampler 206 to ensure the time offset between the samples of both components and samplers 205 and 206 are time aligned.

Still referring to FIG. 2, signal 207, corresponding to the in-phase sampled signal $s_{n,I}(t)$, and signal 208, corresponding to the sampled quadrature signal $s_{n,Q}(t)$, are sent to the offset component generator, 224, where each sample of each component is converted by a $N_{bq}$ bit quantizer. In block 224, each in-phase sample is quantized in 210 into a set of $N_{bq}$ quantization bits 212-$\{1, \ldots, N_{bq}\}$. Also, each quadrature sample is quantized in 211 into a set of $N_{bq}$ quantization bits 213-$\{1, \ldots, N_{bq}\}$. The quantization bits 212-$\{1, \ldots, N_{bq}\}$ and 213-$\{1, \ldots, N_{bq}\}$ are processed individually in two polar component mappers 214 and 215, to generate the set of $N_{bq}$ signals 216-$\{1, \ldots, N_{bq}\}$ with the polar signals $s_{nI,qt}^L$ related with the in-phase component and to generate the set of $N_{bq}$ signals 217-$\{1, \ldots, N_{bq}\}$ with the polar signals $s_{nQ,qt}^L$ related with the quadrature component, respectively. In 218-$\{1, \ldots, N_{bq}\}$, the in-phase polar signals $s_{nI,qt}^L$ are filtered by a set of $N_{bq}$ filters with the same impulsive response and a bandwidth lower than the sampling rate $f_s$. The filtering operation of the set of quadrature polar signals $s_{nQ,qt}^L$ 218-$\{1, \ldots, N_{bq}\}$ is done by the set of $N_{bq}$ filters 219-$\{1, \ldots, N_{bq}\}$ with the same impulsive response of the filters employed in the filtering of the in-phase signals.

The pairs of in-phase filtered signals 220-$\{1, \ldots, N_{bq}\}$ and filtered quadrature signals 221-$\{1, \ldots, N_{bq}\}$ with same amplitude are combined in 223-$\{1, \ldots, N_{bq}\}$ to generate a set 223-$\{1, \ldots, N_{bq}\}$ of $N_{bq}$ offset signals $s_{n,qt,F}^L = s_{nI,qt,F}^L + s_{nQ,qt,F}^L$, $L=1, 2, \ldots, N_{bq}$, with constant or quasi-constant envelope. Blocks $220a_1$-$220a_{Nbq}$ are optional delay blocks that can be used to introduce a time offset between in-phase and quadrature components.

In another embodiment the two quantizers can be replaced by one quantizer with $2N_{bq}$ quantization bits and as inputs the samples of the in-phase component and the samples of the quadrature component. In this quantizer a subset of $N_{bq}$ quantization bits is employed in the quantization of in-phase samples and another set of $N_{bq}$ bits is assigned to the quantization of the quadrature samples.

Figure 3:
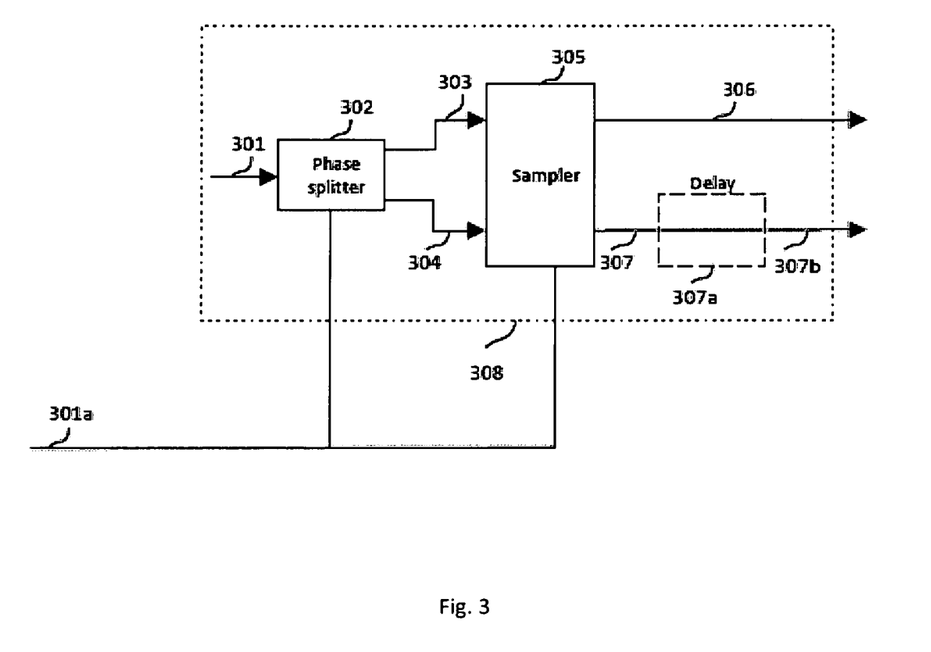
FIG. 3 is a block diagram that illustrates a second exemplary embodiment for the in-phase and quadrature offset sampler block 209 of FIG. 2.

Block diagram 300 of FIG. 3 is an example that illustrates a second embodiment of the block 209 of FIG. 1, with only one sampler as shown in block 308. In the example of FIG. 3, optional components are illustrated with dashed lines. In this example a data signal with time varying envelope 301, and a clock reference signal 301a for the sampling process are received as inputs.

The clock reference signal 301a can be used by the phase splitter 302, and by the sampling block 305. The common clock signal 301a is used to ensure that the outputs of 302 are time aligned, and to ensure that the outputs of block 305 are synchronized. It can be understood by a person skilled in the art that the choice of the clock reference signal is made according to the bandwidth of the input signal and the desired output signal. The input signal 301 is processed in 302 to generate the in-phase component 303 and the quadrature component 304 of the input signal. Both components 303 and 304 are the inputs of the sampling block that originates the sampled signals $s_{n,I}(t)$ and $s_{n,Q}(t)$ of both components at the sampling rate $f_s$ and with a time offset of $\gamma T_s$. In another embodiment the sampling block may generate time aligned samples for both components, being the time offset introduced by an optional delay block 307a connected to the output 307 of the sampler that corresponds to the signal with the samples of the quadrature component. The outputs of the sampling block 306 and 307 (or signal 307b when the delay block is used) are the inputs of the offset component generator 224 of FIG. 2.

Figure 4:
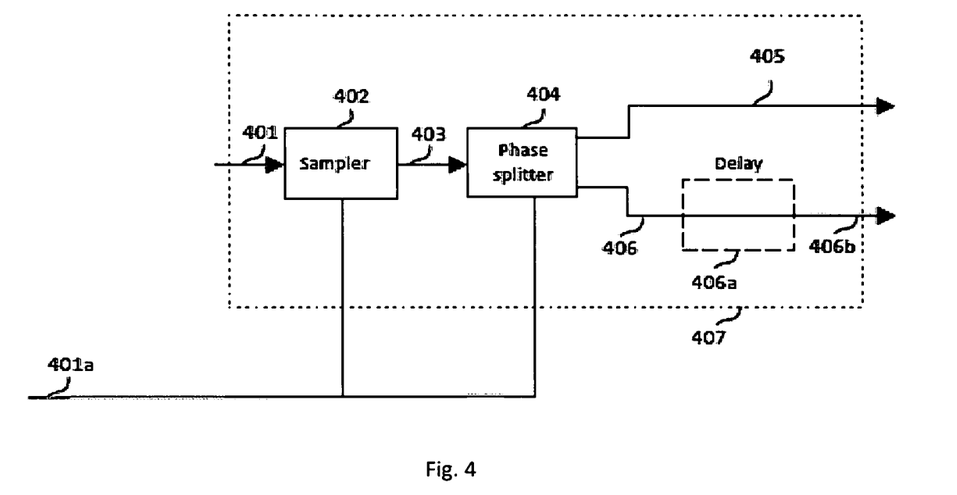
FIG. 4 is a block diagram that illustrates a third exemplary embodiment for the in-phase and quadrature offset sampler block 209 of FIG. 2.

Block diagram 400 of FIG. 4 is an example that illustrates a third embodiment of the block 209 of FIG. 1, with a sampler followed by a phase splitter as shown in block 407. In the example of FIG. 4, optional components are illustrated with dashed lines. In other embodiments, additional components may be optional. In this example a data signal with time varying envelope 401, and a clock reference signal 401a for the sampling process are received as inputs.

The clock reference signal 401a can be used by the sampler 402, and by the phase splitter 404. The common clock signal 401a is used to ensure that the outputs of 404 are synchronized. It can be understood by a person skilled in the art that the choice of the clock reference signal is made according to the bandwidth of the input signal and the desired output signal. The input signal 401 is sampled at a rate of $f_s$ in 402 to generate the sampled signal $s_n(t)$. The samples of input signal 403 are processed in the phase splitter 404 that originates the in-phase and quadrature components $s_{n,I}(t)$ and $s_{n,Q}(t)$ that are the output signals 405 and 406 of block 404. In another embodiment a time offset can be applied to the signal 406 by an optional delay block 406a. The outputs 405 and 406 (or optionally the signal 406b) of the phase splitter block 404 are the inputs of the offset component generator 224.

It can be understood by a person skilled in the art that the choice of the clock reference signal is made according to the bandwidth of the input signal and the desired output signal. As understood by a person skilled in the art other reference clock signals and different reference clock signals may be used by the different blocks. It is noted that two quantizers are employed together with two mappers for purposes of illustration, and not limitation. The scope of the invention covers the use of one quantizer and two mappers or different number of mappers, and implementation of such variations will be apparent to persons skilled in the art based on the teachings contained herein. In another exemplary embodiment, the offset component generator 224 may include a FPGA and lookup tables and the sampling of quadrature component may add the time offset between the in-phase and quadrature samples.

While preferred embodiments of the present disclosure have been described above, the present disclosure is not limited to the specific configurations described above. Various variations and modifications may be made without departing from the scope of the present disclosure. It should be understood by those skilled in the art that various modifications, combinations, sub-combinations and alterations may occur depending on design requirements and other factors insofar as they are within the scope of the appended claims or the equivalents thereof.

4. SUMMARY

Mathematical basis for a new concept related to the decomposition of non offset signals into offset components is provided herein. These new concepts allow arbitrary signals to be constructed from sums of offset components using novel techniques not available commercially, not taught or found in literature or related art. Furthermore, the blend of various techniques and circuits provided in the disclosure provide unique aspects of the invention which permits superior linearity of the amplifiers applied to each offset component. Embodiments of the invention can be implemented by a blend of hardware, software and firmware. Both digital and analog techniques can be used with or without microprocessors and DSP's or with or without FPGAs. Embodiments of the invention can be implemented for communications systems and electronics in general.

5. Conclusions

The present invention has been described above with the aid of functional building blocks illustrating the functions and relationships thereof. The boundaries of these functional building blocks have been arbitrarily defined herein for the convenience of the description. Alternate boundaries can be defined so long as the specified functions and relationships thereof are appropriately performed. Any such alternate boundaries are thus within the scope and spirit of the claimed invention. One person skilled in the art will recognize that these functional building blocks can be implemented by discrete components, processors executing appropriate software and the like and combinations thereof.

While various embodiments of the present invention have been described above, it should be understood that they have been presented by way of example only, and not limitation. Thus, the breadth and scope of the present invention should not be limited by any of the above-described exemplary embodiments but should be defined only in accordance with the following claims and their equivalents.

What is claimed is:

1. A method for decomposition of signals with varying envelope into offset components comprising the following steps:
    receiving a clock signal for reference of an oversampling rate $f_s=1/T_s$, according with a bandwidth B of an input signal s(t) to be sampled, wherein $T_s$ denotes the sampling period;
    receiving the input signal s(t), that can be a modulated single-carrier (SC) signal, a modulated multi-carrier (MC) signal, a baseband single-carrier (SC) signal or baseband multi-carrier (MC) signal, and processing in a phase splitter to obtain as output an in-phase component $s_I(t)$ and a quadrature component $s_q(t)$ from the input signal s(t);
    sampling the in-phase component $s_I(t)$ and the quadrature component $s_q(t)$ at the sampling rate $f_s=1/T_s$, with a time offset $\gamma T_s$ between sample times $nT_s$ to generate samples $s_{nI}$ and $s_{nQ}$ of the in-phase and quadrature components, respectively;
    quantizing the in-phase samples $s_{nI}$ in a quantizer with $N_{bq}$ quantization bits $(\beta_{nI}^{(N_{bq})}, \beta_{nI}^{(N_{bq}-1)}, \ldots, \beta_{nI}^{(1)})$ and a quantization error $$\varepsilon_q = \frac{\Delta}{2},$$

with $\Delta$ denoting a minimum quantization interval, to generate a set of $N_{bq}$ quantization bits corresponding to each quantized in-phase sample taken from a finite in-phase alphabet of quantized values $\in$ I;
    quantizing the quadrature samples $s_{nQ}$ in a quantizer with $N_{bq}$ quantization bits $(\beta_{nQ}^{(N_{bq})}, \beta_{nQ}^{(N_{bq}-1)}, \ldots, \beta_{nQ}^{(1)})$ and a quantization error $$\varepsilon_q = \frac{\Delta}{2},$$

with $\Delta$ denoting the minimum quantization interval, to generate the set of $N_{bq}$ quantization bits corresponding to each quantized quadrature sample taken from a finite quadrature alphabet of quantized values $\in$ Q;
    mapping the quantization bits of the in-phase component in a mapper to generate $N_{bq}$ in-phase polar components given by $$s_{nI,qt}{}^L = 2^{L-1}\Delta\alpha_{nI,L}\delta(t-nT_s), L=1,2,\ldots,N_{bq},$$

in which the quantized in-phase samples can be decomposed, and where $\alpha_{nI,L}=b_{nI}^{(L)}=(-1)\beta_{nI}^{(L)}=\pm 1$, and where $\delta$ denotes a Dirac function;
    mapping the quantization bits of the quadrature component in a mapper to generate $N_{bq}$ quadrature polar components given by $$s_{nQ,qt}{}^L = 2^{L-1}\Delta\alpha_{nQ,L}\delta(t-nT_s-\gamma T_s), L=1,2,\ldots,N_{bq},$$

in which the quantized quadrature samples can be decomposed, and where $\alpha_{nQ,L}=b_{nQ}^{(L)}=(-1)\beta_{nQ}^{(L)}=\pm 1$, and where $\delta$ denotes the Dirac function;
    filtering the $N_{bq}$ polar in-phase and quadrature components $s_{nI,qt}{}^L$ and $s_{nQ,qt}{}^L$ by a filter having a bandwidth of B<$f_s$ comprising an impulsive response r(t) and a frequency response for cancelation of a first replica of the spectrum of the sampled signal, to generate $N_{bq}$ filtered in-phase signal components $$s_{nq,qt,F}{}^L = s_{nI,qt}{}^L * r(t), L=1,2,\ldots,N_{bq},$$

and $N_{bq}$ filtered quadrature signal components $$s_{nI,qt,F}{}^L = s_{nQ,qt}{}^L * r(t), L=1,2,\ldots,N_{bq},$$

where * denotes convolution; and
    combining the filtered in-phase and quadrature components a same amplitude, to generate $N_{bq}$ offset signals $$s_{n,qt,F}{}^L = s_{nI,qt,F}{}^L + s_{nQ,qt,F}{}^L, L=1,2,\ldots,N_{bq},$$

in which the input signal is decomposed.

2. The method of claim 1, wherein said step of receiving said input signal carrying the information comprises:
    receiving a band limited signal with time varying envelope or receiving in-phase and quadrature phase components of a band limited signal with time varying envelope or receiving the samples of in-phase and quadrature components of a band limited signal with time varying envelope or comprises receiving the samples of a band limited signal with time varying envelope.

3. The method of claim 1, wherein the order of said step of processing in the phase splitter the input signal and said step of sampling are reversed, with the input s(t) signal being firstly sampled and the sampled input s(t) signal being processed by the phase splitter to obtain as output an in-phase sampled component $s_I(t)$ and a quadrature sampled component $s_q(t)$ from the sampled input signal s(t), with a delay block in an output associated to the sampled quadrature component to introduce the time offset $\gamma T_s$ between the in-phase and quadrature sampled components.

4. The method of claim 1, wherein said step of quantization comprises:
    two quantizers in parallel, where one quantizes each sample of in-phase component and generates $N_{bq}$ quantization bits that correspond to the quantized version of the in-phase sample and another quantizer that quantizes each sample of quadrature component to generate $N_{bq}$ quantization bits that correspond to the quantized version of the sample of quadrature component.

5. The method of claim 1, wherein said step of quantizing the in-phase samples $s_{nI}$ and said step of quantizing the quadrature samples $s_{nQ}$ comprises only one quantizer with $2N_{bq}$ quantization bits, with $N_{bq}$ bits for the quantization of in-phase samples and $N_{bq}$ quantization bits for the quadrature samples.

6. The method of claim 1, wherein said step of processing the quantization bits comprises:
processing in-phase samples $s_{nI}$ involves processing the $N_{bq}$ in-phase quantization bits in the mapper to generate the corresponding polar components for each quantization bit that are associated to the decomposition of the quantized value of $s_{nI}$ into polar components;
processing the quantization bits quadrature samples $s_{nQ}$ involves processing the $N_{bq}$ quadrature quantization bits in the mapper to generate the corresponding polar components for each quantization bit that are associated to the decomposition of the quantized value of $s_{nQ}$ into polar components.

7. The method of claim 1, wherein said step of quantizing the in-phase samples $s_{nI}$ in the quantizer and said step of processing the quantization bits to generate the polar components by a single mapper-quantizer circuitry that quantizes and maps directly the quantized sample into the corresponding polar components and wherein said step of quantizing the quadrature samples $s_{nQ}$ in the quantizer to generate the quantization bits and said step of processing the quantization bits to generate the polar components by a single mapper-quantizer circuitry that quantizes and maps directly the quantized sample into the corresponding polar components.

8. An apparatus for decomposition of signals with varying envelope into offset components comprising:
an input circuitry for receiving an input signal s(t) carrying information bits;
an input circuitry for receiving a clock signal for reference of an oversampling rate $f_s=1/T_s$, according to a bandwidth B of the input signal;
a phase splitter circuitry for processing said input signal and generating in-phase and quadrature components $s_I(t)$ and $s_q(t)$ from the input signal s(t);
a sampling circuitry for sampling, with a time offset $\gamma T_s$ between sample instant $nT_s$, said in-phase component and said quadrature component of the input signal in accordance with said sampling rate to generate samples $s_{nI}$ of the in-phase and samples $s_{nQ}$ of the quadrature components with the time offset;
a quantizer circuitry coupled to the sampling circuitry for quantizing the in-phase samples $s_{nI}$ and generating $N_{bq}$ in-phase quantization bits $(\beta_{nI}^{(N_{bq})}, \beta_{nI}^{(N_{bq}-1)}, \ldots, \beta_{nI}^{(1)})$ that correspond to each quantized in-phase sample taken from a finite in-phase alphabet of quantized values $\in I$;
a quantizer circuitry coupled to the sampling circuitry for quantizing the quadrature samples $s_{nQ}$ and generating $N_{bq}$ quadrature quantization bits $(\beta_{nI}^{(N_{bq})}, \beta_{nQ}^{(N_{bq}-1)}, \ldots, \beta_{nQ}^{(1)})$ that correspond to each quantized quadrature sample taken from a finite quadrature alphabet of quantized values $\in Q$;
an in-phase polar mapper circuitry coupled to the quantizer circuitry of in-phase component for processing the $N_{bq}$ in-phase quantization bits to generate $N_{bq}$ in-phase polar components given by $$s_{nI,qt}{}^L = 2^{L-1}\Delta\alpha_{nI,L}\delta(t-nT_s), L=1,2,\ldots,N_{bq},$$

in which the quantized in-phase samples are decomposed, and where $\alpha_{nI,L}=b_{nI}^{(L)}=(-1)\beta_{nI}^{(L)}=\pm 1$, and where $\delta$ denotes a Dirac function;
a quadrature polar mapper circuitry coupled to the quantizer circuitry of quadrature component for processing the $N_{bq}$ quadrature quantization bits to generate $N_{bq}$ quadrature polar components given by $$s_{nQ,qt}{}^L = 2^{L-1}\Delta\alpha_{nQ,L}\delta(t-nT_s-\gamma T_s), L=1,2,\ldots,N_{bq},$$

in which the quantized quadrature samples are decomposed, and where $\alpha_{nQ,L}=b_{nQ}^{(L)}=(-1)\beta_{nQ}^{(L)}=\pm 1$, and where $\delta$ denotes a Dirac function;
a filter circuitry for filtering each one of said $N_{bq}$ in-phase polar signal components by $N_{bq}$ filters with impulsive response r(t) and a bandwidth $B<f_s$ to generate $N_{bq}$ filtered in-phase signal components $$s_{nq,qt,F}{}^L = s_{nI,qt}{}^L * r(t), L=1,2,\ldots,N_{bq},$$

where * denotes convolution;
a filter circuitry for filtering each one of said $N_{bq}$ quadrature polar signal components by $N_{bq}$ filters with impulsive response r(t) and a bandwidth $B<f_s$ to generate $N_{bq}$ filtered quadrature signal components $$s_{nI,qt,F}{}^L = s_{nQ,qt}{}^L * r(t), L=1,2,\ldots,N_{bq}$$

where * denotes convolution; and
a combining circuitry for combining the filtered in-phase and quadrature signals by summing pairs of in-phase components and quadrature filtered components with same amplitude to generate $N_{bq}$ offset signals $$s_{n,qt,F}{}^L = s_{nI,qt,F}{}^L + s_{nQ,qt,F}{}^L, L=1,2,\ldots,N_{bq},$$

in which the input signal is decomposed.

9. The apparatus of claim 8, wherein said sampling circuitry is placed before said phase splitter circuitry for processing said input signal and generating the in-phase and quadrature components.

10. The apparatus of claim 8, wherein said sampling circuitry is arranged to sample, in same instants, said in-phase component and said quadrature component of the input signal in accordance with the said sampling rate $f_s$ to generate the samples of the in-phase and quadrature component, and the apparatus further comprising an output branch coupled to a delay circuitry for introducing a time offset in the samples of the quadrature component.

11. The apparatus of claim 8, comprising one quantizer with $2N_{bq}$ bits connected to two mappers for the quantization of samples of in-phase and quadrature components, that generate $N_{bq}$ in-phase polar components and $N_{bq}$ quadrature polar components.

12. The apparatus of claim 8, comprising mappers for the quantization and mapping of the quantized bits by directly making the conversion in-phase samples $s_{nI}$ and quadrature samples $s_{nQ}$ into corresponding sets of $N_{bq}$ in-phase polar components and $N_{bq}$ quadrature polar components, respectively.

13. The apparatus of claim 8, wherein the sampling circuitry, the quantizer circuitry and the mapper circuitry is implemented by field programmable gate arrays (FPGA), microprocessors, or digital signal processors (DSPs) with look up tables.

14. The apparatus of 8, wherein said filters for filtering each polar signal component are impulse response (FIR) filters, analogue filters, digital filters or analog-to-digital converters (ADC).

* * * * *